US010740176B2

(12) United States Patent
Zhang et al.

(10) Patent No.: US 10,740,176 B2
(45) Date of Patent: Aug. 11, 2020

(54) COMPUTING SYSTEM WITH SHIFT ADJUSTABLE CODING MECHANISM AND METHOD OF OPERATION THEREOF

(71) Applicant: CNEX LABS, Inc., San Jose, CA (US)

(72) Inventors: Xiaojie Zhang, Saratoga, CA (US); Pengfei Huang, San Diego, CA (US)

(73) Assignee: CNEX LABS, Inc., San Jose, CA (US)

( * ) Notice: Subject to any disclaimer, the term of this patent is extended or adjusted under 35 U.S.C. 154(b) by 0 days.

(21) Appl. No.: 15/336,325

(22) Filed: Oct. 27, 2016

(65) Prior Publication Data

US 2018/0081755 A1 Mar. 22, 2018

Related U.S. Application Data

(60) Provisional application No. 62/396,388, filed on Sep. 19, 2016.

(51) Int. Cl.
*G06F 11/10* (2006.01)
*G06F 3/06* (2006.01)
*G11C 29/52* (2006.01)
*G11C 29/02* (2006.01)

(52) U.S. Cl.
CPC .......... *G06F 11/1068* (2013.01); *G06F 3/064* (2013.01); *G06F 3/0619* (2013.01); *G06F 3/0659* (2013.01); *G06F 3/0679* (2013.01); *G06F 11/1048* (2013.01); *G11C 29/52* (2013.01); *G11C 29/028* (2013.01)

(58) Field of Classification Search
CPC ............. G06F 11/1076; G06F 11/1008; G06F 11/106; G06F 11/1068; G06F 3/0619; G06F 3/064; G06F 3/0679; G06F 11/1048; G06F 3/0659; H05K 999/99; G11C 2029/0411; G11C 29/52; G11C 29/028
USPC ....................................... 714/764
See application file for complete search history.

(56) References Cited

U.S. PATENT DOCUMENTS

| 7,844,880 B2* | 11/2010 | Vainsencher | ....... | G06F 11/1068 714/764 |
| 8,954,828 B2* | 2/2015 | Torii | ..................... | H03M 13/09 714/755 |
| 2004/0133836 A1* | 7/2004 | Williams | .............. | H03M 13/00 714/746 |
| 2009/0006927 A1* | 1/2009 | Sayadi | .................. | H04L 1/0041 714/762 |

(Continued)

*Primary Examiner* — Albert Decady
*Assistant Examiner* — Enam Ahmed
(74) *Attorney, Agent, or Firm* — Perspectives Law Group, Corp.

(57) ABSTRACT

A computing system includes: a control circuit for determining a user data, generating a base set including a base protection data based on encoding the user data, calculating an extra protection data based on encoding the base set; and a storage circuit for storing the extra protection data (210) corresponding to the base set.
The computing system can further include: an storage circuit for providing a received codeword corresponding to a user data and a base protection data, providing an extra protection data corresponding to the received codeword; and a control circuit for calculating a base syndrome from the received codeword, calculating a further syndrome from the extra protection data, and decoding the received codeword to recover the user data, the base protection data, or a combination thereof using the base syndrome and the further syndrome.

12 Claims, 6 Drawing Sheets

(56) References Cited

U.S. PATENT DOCUMENTS

| | | | |
|---|---|---|---|
| 2010/0293440 A1* | 11/2010 | Thatcher | G06F 11/073 714/764 |
| 2012/0278687 A1* | 11/2012 | Sharon | G06F 11/1048 714/790 |
| 2014/0181620 A1* | 6/2014 | Kotzur | G06F 11/1068 714/764 |
| 2014/0344643 A1* | 11/2014 | Hughes, Jr. | G06F 11/1048 714/763 |
| 2015/0347230 A1* | 12/2015 | Anholt | H03M 13/1525 714/764 |
| 2016/0034349 A1* | 2/2016 | Choi | G11C 11/5642 714/764 |
| 2016/0062833 A1* | 3/2016 | Slik | G06F 11/1076 714/764 |
| 2016/0070474 A1* | 3/2016 | Yu | G06F 3/0608 711/103 |
| 2016/0098317 A1* | 4/2016 | Alhussien | G06F 11/1068 714/764 |
| 2016/0103732 A1* | 4/2016 | Tuers | G06F 11/1048 714/764 |
| 2016/0196179 A1* | 7/2016 | Zhao | H03M 13/356 714/764 |
| 2017/0090761 A1* | 3/2017 | Hasegawa | G06F 3/064 |
| 2018/0004602 A1* | 1/2018 | Chih | H03M 13/2906 |

* cited by examiner

__US 10,740,176 B2__

COMPUTING SYSTEM WITH SHIFT ADJUSTABLE CODING MECHANISM AND METHOD OF OPERATION THEREOF

CROSS-REFERENCE TO RELATED APPLICATION(S)

This application claims the benefit of U.S. Provisional Patent Application Ser. No. 62/396,388 filed Sep. 19, 2016, and the subject matter thereof is incorporated herein by reference thereto.

TECHNICAL FIELD

An embodiment of the present invention relates generally to a computing system, and more particularly to a system for data protection.

BACKGROUND

Modern consumer and industrial electronics, especially devices such as graphical computing systems, televisions, projectors, cellular phones, portable digital assistants, and combination devices, are providing increasing levels of functionality to support modern life including three-dimensional display services. Research and development in the existing technologies can take a myriad of different directions. As data become more pervasive, existing and new systems need to interoperate and provide data reliability.

Thus, a need still remains for a computing system with adjustable coding mechanism to provide improved data reliability and recovery. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an apparatus, including a control circuit configured to: determine a user data, generate a base set including a base protection data based on encoding the user data, calculate an extra protection data based on encoding the base set; and a storage circuit, coupled to the control circuit, configured to store the extra protection data corresponding to the base set.

An embodiment of the present invention provides an apparatus, including an storage circuit configured to: provide a received codeword corresponding to a user data and a base protection data, provide an extra protection data corresponding to the received codeword; a control circuit, coupled to the storage interface circuit, configured to: calculate a base syndrome from the received codeword, calculate a further syndrome from the extra protection data, and decode the received codeword to recover the user data, the base protection data, or a combination thereof using the base syndrome and the further syndrome.

An embodiment of the present invention provides an apparatus, including an access circuit configured to: provide a received codeword corresponding to a user data and a base protection data, provide an extra protection data corresponding to the received codeword; a control circuit, coupled to the storage interface circuit, configured to: calculate a base syndrome from the received codeword, calculate a further syndrome from the extra protection data, and decode the received codeword to recover the user data, the base protection data, or a combination thereof using the base syndrome and the further syndrome.

An embodiment of the present invention provides a method including accessing a received codeword corresponding to a user data and a base protection data; calculating a base syndrome from the received codeword; accessing an extra protection data corresponding to the received codeword; calculating a further syndrome from the extra protection data; and decoding the received codeword to recover the user data, the base protection data, or a combination thereof using the base syndrome and the further syndrome.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
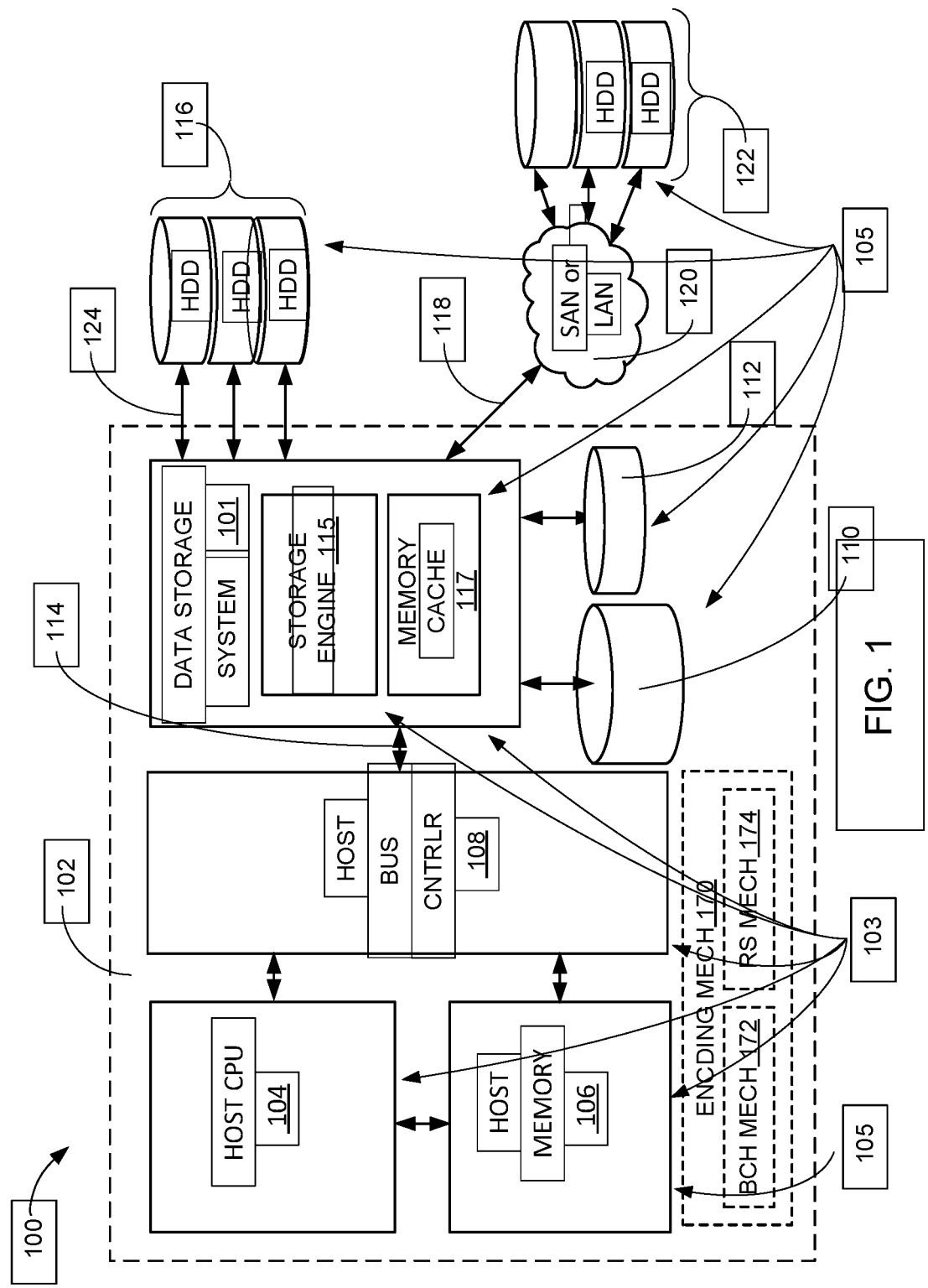
FIG. 1 is a computing system with adjustable coding mechanism in an embodiment of the present invention.

The following embodiments can provide extra protection data based on further decoding a base set. The base set can include base protection data resulting from initially encoding user data. The base protection data and the extra protection data can both be processed using the same encoding-decoding mechanism. The extra protection data can be calculated or generated using a decoder or a portion therein. The extra protection data can be stored in a separate location or device from the base set, such as a different or "good" instance of a data page to provide additional error correction power for the base set stored in "bad" page for NAND Flash storage embodiments.

The decoder can be utilized to decode a received codeword corresponding to the base set. If the decoding operation returns an inner-decoding failure status using the base protection data, the decoder can utilize the extra protection data to recover the user data, the base protection data, or a combination thereof. The decoder can calculate or generate a further syndrome corresponding to the extra protection data, and separate from or in addition to a base syndrome corresponding to the base protection data. The syndromes can be calculated or generated using a primitive root corresponding to a coding pattern or a generator function utilized for the encoder. The decoder can recover the user data, the base protection data, or a combination thereof using the further syndrome and the base syndrome. As mentioned, the decoder or a portion therein can further be utilized or leveraged to calculate or generate the extra protection data for the encoding process.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof. Further, if a module is written in the apparatus claims section below, the modules are deemed to include hardware circuitry for the purposes and the scope of apparatus claims.

Referring now to FIG. 1, therein is shown a computing system 100 with data protection mechanism in an embodiment of the present invention. The computing system 100 is depicted in FIG. 1 as a functional block diagram of the computing system 100 with a data storage system 101. The functional block diagram depicts the data storage system 101 installed in a host computer 102.

As an example, the host computer 102 can be as a server or workstation. The host computer 102 can include at least a host central processing unit 104, host memory 106 coupled to the host central processing unit 104, and a host bus controller 108. The host bus controller 108 provides a host interface bus 114, which allows the host computer 102 to utilize the data storage system 101.

It is understood that the function of the host bus controller 108 can be provided by host central processing unit 104 in some implementations. The host central processing unit 104 can be implemented with hardware circuitry in a number of different manners. For example, the host central processing unit 104 can be a processor, an application specific integrated circuit (ASIC) an embedded processor, a microprocessor, a hardware control logic, a hardware finite state machine (FSM), a digital signal processor (DSP), or a combination thereof.

The data storage system 101 can be coupled to a solid state disk 110, such as a non-volatile memory based storage device having a peripheral interface system, or a non-volatile memory 112, such as an internal memory card for expanded or extended non-volatile system memory.

The data storage system 101 can also be coupled to hard disk drives (HDD) 116 that can be mounted in the host computer 102, external to the host computer 102, or a combination thereof. The solid state disk 110, the non-volatile memory 112, and the hard disk drives 116 can be considered as direct attached storage (DAS) devices, as an example.

The data storage system 101 can also support a network attach port 118 for coupling a network 120. Examples of the network 120 can be a local area network (LAN) and a storage area network (SAN). The network attach port 118 can provide access to network attached storage (NAS) devices 122.

While the network attached storage devices 122 are shown as hard disk drives, this is an example only. It is understood that the network attached storage devices 122 could include magnetic tape storage (not shown), and storage devices similar to the solid state disk 110, the non-volatile memory 112, or the hard disk drives 116 that are accessed through the network attach port 118. Also, the network attached storage devices 122 can include just a bunch of disks (JBOD) systems or redundant array of intelligent disks (RAID) systems as well as other network attached storage devices 122.

The data storage system 101 can be attached to the host interface bus 114 for providing access to and interfacing to multiple of the direct attached storage (DAS) devices via a cable 124 for storage interface, such as Serial Advanced Technology Attachment (SATA), the Serial Attached SCSI (SAS), or the Peripheral Component Interconnect-Express (PCI-e) attached storage devices.

The data storage system 101 can include a storage engine 115 and memory devices 117. The storage engine 115 can be implemented with hardware circuitry, software, or a combination thereof in a number of ways. For example, the storage engine 115 can be implemented as a processor, an application specific integrated circuit (ASIC) an embedded processor, a microprocessor, a hardware control logic, a hardware finite state machine (FSM), a digital signal processor (DSP), or a combination thereof.

The storage engine 115 can control the flow and management of data to and from the host computer 102, and from and to the direct attached storage (DAS) devices, the network attached storage devices 122, or a combination thereof. The storage engine 115 can also perform data reliability check and correction, which will be further discussed later. The storage engine 115 can also control and manage the flow of data between the direct attached storage (DAS) devices and the network attached storage devices 122 and amongst themselves. The storage engine 115 can be implemented in hardware circuitry, a processor running software, or a combination thereof.

For illustrative purposes, the storage engine 115 is shown as part of the data storage system 101, although the storage engine 115 can be implemented and partitioned differently.

For example, the storage engine 115 can be implemented as part of in the host computer 102, implemented partially in software and partially implemented in hardware, or a combination thereof. The storage engine 115 can be external to the data storage system 101. As examples, the storage engine 115 can be part of the direct attached storage (DAS) devices described above, the network attached storage devices 122, or a combination thereof. The functionalities of the storage engine 115 can be distributed as part of the host computer 102, the direct attached storage (DAS) devices, the network attached storage devices 122, or a combination thereof.

The memory devices 117 can function as a local cache to the data storage system 101, the computing system 100, or a combination thereof. The memory devices 117 can be a volatile memory or a nonvolatile memory. Examples of the volatile memory can be static random access memory (SRAM) or dynamic random access memory (DRAM).

The storage engine 115 and the memory devices 117 enable the data storage system 101 to meet the performance requirements of data provided by the host computer 102 and store that data in the solid state disk 110, the non-volatile memory 112, the hard disk drives 116, or the network attached storage devices 122.

For illustrative purposes, the data storage system 101 is shown as part of the host computer 102, although the data storage system 101 can be implemented and partitioned differently. For example, the data storage system 101 can be implemented as a plug-in card in the host computer 102, as part of a chip or chipset in the host computer 102, as partially implement in software and partially implemented in hardware in the host computer 102, or a combination thereof. The data storage system 101 can be external to the host computer 102. As examples, the data storage system 101 can be part of the direct attached storage (DAS) devices described above, the network attached storage devices 122, or a combination thereof. The data storage system 101 can be distributed as part of the host computer 102, the direct attached storage (DAS) devices, the network attached storage devices 122, or a combination thereof.

The computing system 100 can include and utilize an encoding and decoding mechanism for processing information. The computing system 100 can encode the information prior to storage. The computing system 100 can decode the stored data for accessing the information. The computing system 100 can utilize the encoding and decoding mechanism to detect, correct, or a combination for errors. The computing system 100 can further utilize the encoding and decoding mechanism for data compression, cryptography, communication, or a combination thereof.

The computing system 100 can utilize an encoding-decoding mechanism 170. The encoding-decoding mechanism 170 is a circuit, a device, a method, a system, a process, or a combination thereof for converting data from one form to another.

The encoding-decoding mechanism 170 can be used to encode intended or targeted data for providing error protection, error detection, error correction, redundancy, or a combination thereof. The encoding-decoding mechanism 170 can be used to decode received or accessed data to recover the intended or target data based on error detection, error correction, redundancy, or a combination of processes thereof.

The encoding-decoding mechanism 170 can be based on a standard, an algorithm, or a combination thereof predetermined by or known to the computing system 100. For example, the computing system 100 can utilize linear codes, such as including linear block codes or convolutional codes.

As a more specific example, the computing system 100 can utilize cyclic codes, repetition codes, parity codes, polynomial codes, geometric codes, algebraic codes, probabilistic codes, or a combination thereof. Also as a more specific example, the computing system 100 can utilize the encoding-decoding mechanism 170 including a Bose-Chaudhuri-Hocquenghem (BCH) mechanism 172, a Reed-Solomon (RS) mechanism 174, or a combination thereof.

The encoding-decoding mechanism 170 can be included in, integral with, or a combination thereof for the host computer 102 or a portion or circuit therein, the solid state disk 116, the network attached storage devices 122, or a combination thereof. For illustrative purposes, the computing system 100 will be described as utilizing the BCH mechanism 172. However, it is understood that the computing system 100 can utilize any other type of coding mechanism as described above.

Also for illustrative purposes, the computing system 100 will be described as utilizing the coding mechanism in storing and accessing information with NAND flash memory. However, it is understood that the computing system 100 can utilize the coding mechanism with other types of memory, such as volatile memory, other types of flash or non-volatile memory, or a combination thereof. The computing system 100 can further utilize the coding mechanism with other applications, such as communication or cryptography, as discussed above.

In NAND flash storage, the basic unit of NAND read can be a page, whose size can be fixed throughout its lifetime. The size of a NAND flash page can usually be 8 KB or 16 KB, along with some extra space that can be called "spare space", and can be generally used for storing meta-data and error correction code (ECC) redundancy. The amount of user data stored per page can be fixed, such as for 8 KB, 16 KB, or other size depending on the NAND flash physical size specification.

The spare space that can be used for ECC parities can also be fixed. For the same type of ECC, the code rate, or the ratio of its information size to its code length known as information size plus parity size, determines its error correction power. Generally speaking, with larger parity, more bits can be corrected using an ECC codeword. Therefore, when ECC codewords, including both user data and parities, are stored in a single NAND flash page, the correction power provided by the ECC can be fixed throughout the lifetime of the NAND.

However, the characteristic of NAND flash can lead to the number of error bits increasing as the number of program/erase (P/E) cycles increases. In other words, in order to increase the reliability of NAND flash at or towards its end of lifetime or to extend its lifetime, stronger ECC that can correct more error bits can be required as P/E cycles increases.

Further, certain NAND flash pages can be more prone to errors than others. The computing system 100 can utilize stronger ECC to protect such "bad page", and utilize ECC of regular strength for other pages to provide sufficient error correction power.

The computing system 100 can utilize extra or additional coding mechanism in addition to and in combination with other coding mechanism. The computing system 100 can utilize ECC codewords whose parities can be divided and stored in separate places. The computing system 100 can store part of the ECC parity in the same flash page as user data to provide fast access and regular error correction power by itself, and other part of the ECC parity can be stored somewhere else and received only when regular decoding fails.

Figure 2:
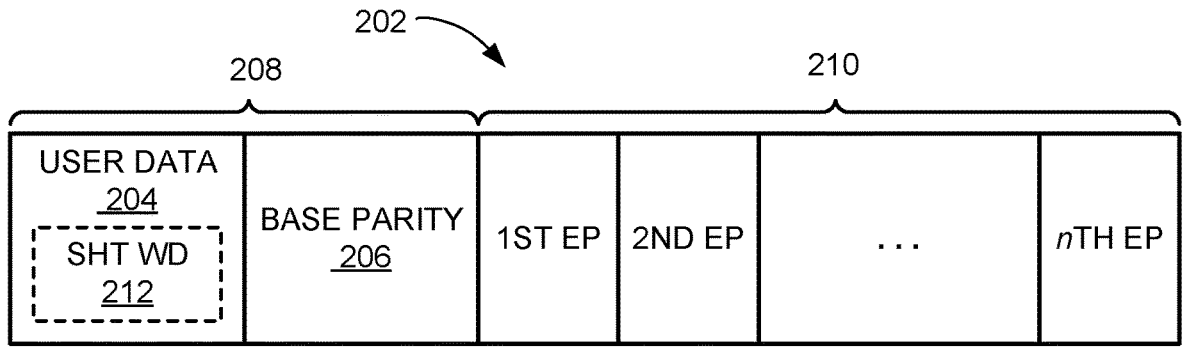
FIG. 2 is an exemplary diagram of a data unit in an embodiment.

Referring now to FIG. 2, therein is shown an exemplary diagram of a data unit 202 in an embodiment. The data unit 202 can include an encoded output for user data 204. The data unit 202 can include the user data 204 along with base protection data 206 for a base set 208, extra protection data 210, or a combination thereof.

The user data 204 can include the information or data serving as content. The user data 204 can be the target or the subject of the encoding process and the desired result of the decoding process. For example, the user data 204 can include the content intended for storage and retrieval at a later time or a different device, for communication between devices, for encryption and decryption, or a combination thereof.

The computing system 100 can process the user data 204 to generate the base protection data 206. The base protection data 206 is information corresponding to the user data 204, utilized to detect errors in the base set 208, to correct errors in the base set 208, or a combination thereof in accessing the base set 208 at a later time, at a different device, or a combination thereof. For example, the base protection data 206 can include redundancy data, parity data, or a combination thereof, such as cyclic redundancy check (CRC) redundancy or BCH parity information.

The computing system 100 can utilize the user data 204 and the base protection data 206 as the base set 208. The computing system 100 can combine the user data 204 and the base protection data 206 for the base set 208. The computing system 100 can further append the base protection data 206 to the user data 204 for the base set 208.

The computing system 100 can store or communicate the base set 208 as a single unit of encoded information, such as a codeword. For example, the computing system 100 can store the user data 204 and the corresponding instance of the base protection data 206 in the same data page, sector, chip, address, or a combination thereof. Also for example, the computing system 100 can communicate the user data 204 and the corresponding instance of the base protection data 206 sequentially in time, over the same frequency, using the same channel or resource, or a combination thereof.

As a more specific example, the base set 208 can represent an original systematic BCH codeword. Also as a more specific example, the base set 208 can be a shortened codeword 212. The shortened codeword 212 can correspond to a size or a length of data or information less than prescribed by or a maximum for the encoding-decoding mechanism 170 of FIG. 1.

The computing system 100 can further process the base set 208 for increased protection against data errors or loss. The computing system 100 can encode the base set 208 further to generate the extra protection (EP) 210. The extra protection data 210 can be similar to the base protection data 206 but generated using the base set 208 instead of only the user data 204.

For example, the extra protection data 210 can include BCH parity of the base set 208 including the base protection data 206 in addition to the user data 204. Also for example, the extra protection data 210 can include CRC redundancy of the base set 208 including the base protection data 206 in addition to the user data 204.

The computing system 100 can process the base set 208 multiple times to further encode with the encoding result of the previous iteration. For example, the first instance of the extra protection data 210 can be based on processing or encoding the base set 208. The second instance of the extra protection data 210 can be based on processing or encoding base set 208 along with or in addition to the first instance of the extra protection data 210.

The computing system 100 can generate the extra protection data 210 using the same hardware, process, method, circuitry, or a combination thereof as the base parity 206. For example, the computing system 100 can generate the extra protection data 210 using the same encoding module as the base protection data 206. Also for example, the computing system 100 can generate the extra protection data 210 using the part of decoding module used to decode the base set 208.

The computing system 100 can store or communicate the extra protection data 210 along with or separate from the base set 208. The computing system 100 can also store or communicate the different parts of the extra protection data 210, denoted as nTH EP in FIG. 2, together or separately. For example, the base set 208 and the extra protection data 210 can be stored at the same location or resource, communicated together, or a combination thereof, such as for the user data 204 and the base protection data 206. Similarly, the different parts of the extra protection data 210 can be stored or communicated in the above way.

Also for example, the base set 208 and the extra protection data 210 can be separated and stored at different data pages, sectors, chips, addresses, or a combination thereof. Also for example, the base set 208 and the extra protection data 210 can be separated and communicated at different times, over different frequencies, using different channels or resources, or a combination thereof. Similarly, the different parts of the extra protection data 210 can be stored or communicated in the above way.

The extra protection data 210 can be further protected by one or more different ECC codeword. Further, multiple instances of the extra protection data 210 can be packed into one single ECC codeword and share the same ECC parity.

It has been discovered that the extra protection data 210 provides stronger error correction capabilities. The extra protection data 210 provides additional recoverability based providing further redundancies or parities. Moreover, the extra protection data 210 can be configured to adapt and provide varying or dynamic coding rate. The extra protection data 210 can be used to dynamically vary the overhead or redundancy in comparison to the user data 204 without being limited to a fixed size or dimension according to the coding scheme.

It has further been discovered that the extra protection data 210 utilizing the same encoding module as the base protection data 208 provides stronger error correction capabilities without added cost or resources. The same encoding scheme can be repeated to generate the extra protection data 210, which also means that the decoding process can remain the same or with minimal changes. The repetitive pattern can be leveraged to decode, minimizing the need for additional modules to save memory, circuit size, processing speed, processing efficiency, additional functions or a combination thereof. The extra protection data 210 can further leverage simple and standard code designs leading to simple encoder and decoder designs with efficiency in implementation.

It has further been discovered that the extra protection data 210 stored or communicated separate from the base set 208 provides reduced error rates. The computing system 100 can utilize a data page, a sector, a circuit portion, a resource, a channel, a frequency, or a combination thereof known to be bad or below some threshold predetermined by the computing system 100 for the base set 208. The computing system 100 can utilize a different page, sector, circuit portion, resource, channel, frequency, or a combination thereof to store or communicate the extra protection data 210 to increase the recoverability of the base set 208.

For example, BCH correction power, which is otherwise limited by the spare size and fixed through the life time of a NAND flash page, can be varied using the extra protection data 210. Without increasing the space to account for the increase in the base protection data 206 to increase the BCH correction power, the computing system 100 can generate the extra protection data 210 for the user data 204 stored on known bad pages. The extra protection data 210 can be stored separately on a good page, which can increase the recoverability of the user data 204 stored on the bad page. It has been discovered that the extra protection data 210 stored on the good page of NAND flash page can extend the life of the flash device and the bad pages therein.

The size or capacity of the extra protection data 210 can be controlled based on an amount of error correction power desired for the computing system 100. The rate of BCH codes can be configured to have similar error correction power as the BCH code with extra protection in bad pages.

As a more specific example, one page size can be 16K Bytes for the user data 204 and 1872 Bytes of spare, with 1K Byte-60 for maximum BCH correction. For other examples, the user data 204 can be 16 KB with spare size of 2208 Bytes, 1280 Bytes or 1952 Bytes. Also for other examples, the maximum BCH correction can be 1K Byte-72, 1K Byte-40 or 1K Byte-64.

The computing system 100 can use the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof to process and encode as discussed above. The computing system 100 can store the various information, such as the user data 204, the base protection data 206, the base set 208, or a combination thereof in the host memory 106, the memory cache 117 of FIG. 1, the solid state disk 110 of FIG. 1, the non-volatile memory 112 of FIG. 1, the hard disk drives 116 of FIG. 1, the NAS devices 122 of FIG. 1, or a combination thereof. The computing system 100 can store the extra protection data 210 along with or separate from the base set 208, such as in a different instance of or a different location within the host memory 106, the memory cache 117, the solid state disk 110, the non-volatile memory 112, the hard disk drives 116, the NAS devices 122, or a combination thereof.

Figure 3:
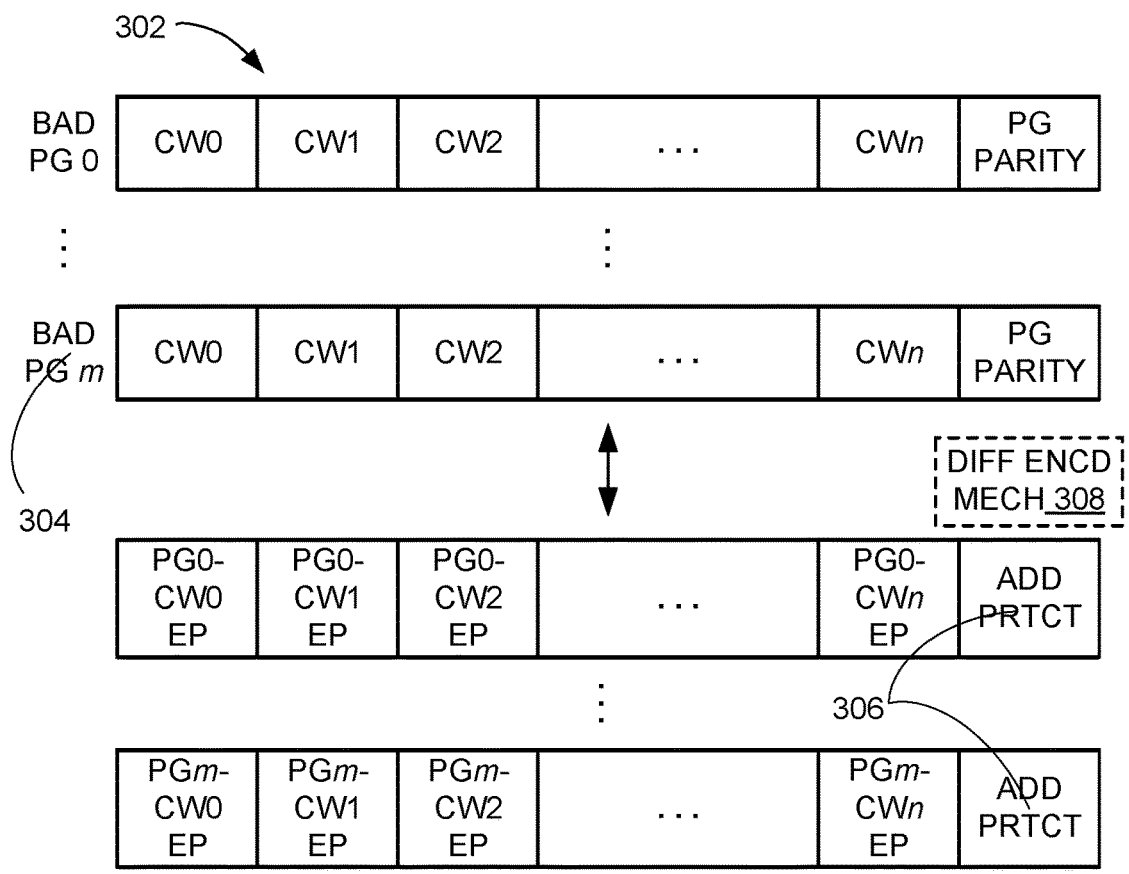
FIG. 3 is an exemplary diagram of a data group in an embodiment.

Referring now to FIG. 3, therein is shown an exemplary diagram of a data group 302 in an embodiment. The data group 302 can include multiple instances of the base set 208 of FIG. 2, the corresponding instance of the extra protection data 210 of FIG. 2, or a combination thereof.

For example, the data group 302 can include one or more flash data pages 304, each including or storing multiple instances of the base set 208, multiple instances of the extra protection data 210, or a combination thereof. Each of the stored instances of the base set 208 can further correspond to an instance of the extra protection data 210 stored on a different page.

As a more specific example, the computing system 100 can include a NAND flash device including "good page" and "bad page" for storing data. The "good page" and "bad page" can be determined based on a criterion, a condition, a threshold, or a combination thereof predetermined by the computing system 100.

Each of the data pages 304 of the NAND flash drive can include 16 instances of 1 KB BCH codewords for the base set 208. The computing system 100 can further generate and utilize a group protection data for the data group 302, such as a page. The computing system 100 can further utilize further protection utilizing other directions, such as vertically across the data pages 304, diagonally according to a shifting pattern going across the data pages 304, or a combination thereof. The extra protection can further work without such group protection.

Depending on the application, one or more instances of the extra protection data 210 can also have its own ECC parity or protection data to correct possible errors. Different EPs of different codeword from the same flash page do not have to be stored together but can be stored in different locations.

For example, the computing system 100 can generate additional protection 306 for protecting and encoding the extra protection data 210. The additional protection 306 can correspond to the extra protection data 210, along with or the without base set 208. The computing system 100 can generate the additional protection 306 using a different encoding mechanism 308.

The different coding mechanism 308 is a circuit, a device, a method, a system, a process, or a combination thereof for converting data from one form to another different from the encoding-decoding mechanism 170 of FIG. 1. The different coding mechanism 308 can be a different circuit, process, or function, an implementation of a different algorithm, or a combination thereof.

For the base set 208 stored on bad pages, the computing system 100 can further generate the extra protection data 210 independent of or separate from the group parity data. The extra protection data 210 can be associated or correlated with the corresponding instance of the base set 208, and stored on a known good page.

The computing system 100 can further store the base set 208 in locations that can be accessed with least latency or complexity. The computing system 100 can store the extra protection data 210 at locations without being limited by the latency or complexity.

It has been discovered that the extra protection data 210 provides increased flexibility. The flash page storing the base set 208 can remain unchanged. This means the extra protection data 210 can be added to any base set 208 at any time, even after the BCH codes have been encoded and stored in flash. For example, during the lifetime of a NAND flash SSD, some pages can be more error prone than other pages and have more error bits. Then, instead of marking such page as invalid and stopping usage of them, the computing system 100 can use extra protection data 210 to provide increased error correction power to these "bad pages" by generating the extra protection data 210 and storing them in separate "good" locations.

Figure 4:
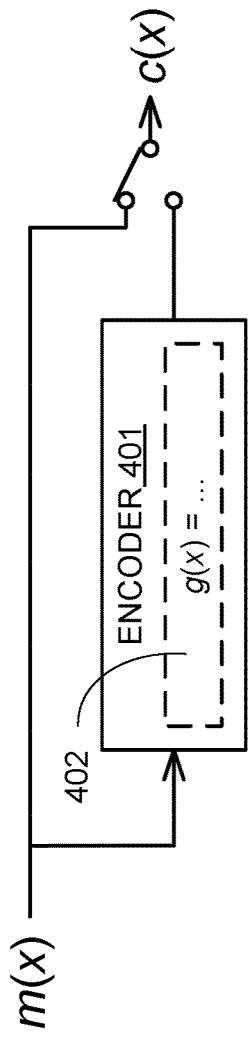
FIG. 4 is an exemplary architectural diagram of an encoder in an embodiment.

Referring now to FIG. 4, therein is shown an exemplary architectural diagram of an encoder 401 in an embodiment. The encoder 401 can include a circuit, a function, a process, a method, or a combination thereof for converting information into a coded format. The encoder 401 can correspond to a circuit, a device, a function, or a combination thereof for encrypting, transmitting, storing, or a combination thereof for the user data 204 of FIG. 2.

The encoder 401 can determine the user data 204 represented as 'm(x)'. The encoder 401 can determine the data targeted for the encoding process based on receiving the data from another device or from a user, selecting or accessing data stored at a known location, or a combination thereof. The user data 204, the base set 208 of FIG. 2 resulting from encoding the user data 204, or a combination thereof can be data intended for communication, storage, encryption, or a combination thereof.

The encoder 401 can generate the base set 208 including the base protection data 206 of FIG. 2 based on encoding or processing an input of the user data 204. As an example, the encoder 401 can be implemented using a shift register encoder for BCH encoding. Also as an example, the encoder 401 can include other designs or implementations for different coding schemes as discussed above.

The encoder 401 can utilize a coding pattern 402. The coding pattern 402 can include a specific design, sequence, or arrangement for processing, encoding, decoding, or a combination thereof for the data. The coding pattern 402 can include a generator polynomial or an encoding pattern.

The generator polynomial or the encoding pattern can include information utilized to encode the targeted information. The encoder 401 can process the user data 204, the base set 208, or a combination thereof based on or using the coding pattern 402.

For example, the encoder 401 can perform a division or a modulo operation on the user data 204, the base set 208, or a combination thereof with the generator polynomial. As a more specific example, the encoder 401 can include or be implemented with shift registers corresponding to the exponent values and taps, or 'OR' operators corresponding to the location or value of the exponents for the generator polynomial. The base protection data 206, the user data 204, or a combination thereof can be represented as 'c(x)'.

The encoder 401 can generate the base protection data 206 of FIG. 2 for the user data 204 as output. The base protection data 206 can include information utilized to detect any errors, recover from errors or lost information, or a combination thereof in accessing the user data 204 at a later time, using a different device, or a combination thereof.

As a more specific example, the BCH codeword for the base set 208 can be represented as $c(c_0, \ldots, c_{n-1})$. Further, the polynomial of the base set 208 can be represented as $c(x)=c_0+ \ldots +c_{n-1}x^{n-1}$, which includes both user data part and parity part.

The encoder 401 can use or be implemented as a portion within one or more control circuits 103, of FIG. 1 such as for the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof. The computing system 100 can store the various input or output information, such as the user data 204, the base protection data 206, the base set 208, or a combination thereof in one or more storage circuits 105 of FIG. 1 or access circuits, such as for the host memory 106, the memory cache 117 of FIG. 1, the solid state disk 110 of FIG. 1, the non-volatile memory 112 of FIG. 1, the hard disk drives 116 of FIG. 1, the NAS devices 122 of FIG. 1, or a combination thereof. The encoder 401 can be implemented in software, such as using functions or operators, in hardware, such as using circuits with registers or adders or multipliers, or a combination thereof.

Figure 5:
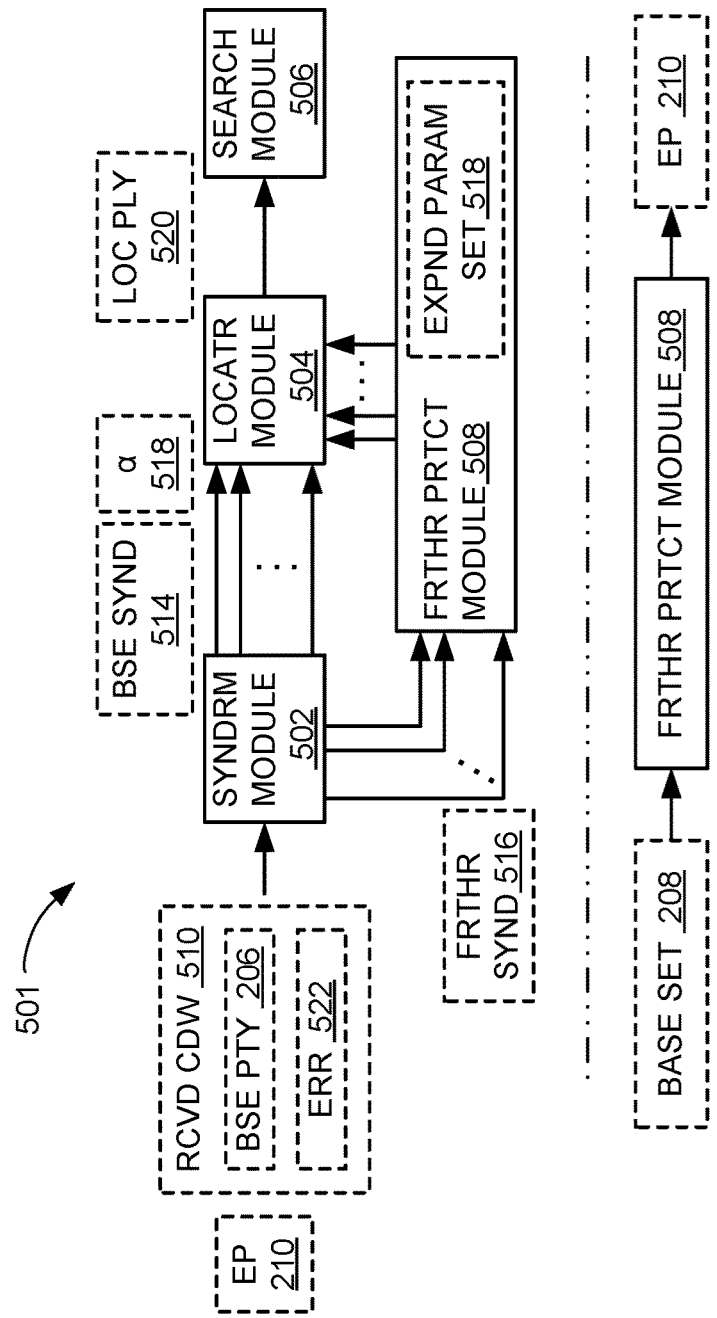
FIG. 5 is an exemplary architectural diagram of a decoder in an embodiment.

Referring now to FIG. 5, therein is shown an exemplary architectural diagram of a decoder 501 in an embodiment. The decoder 501 can be utilized to recover the user data 204 of FIG. 2, detect or correct one or more unintended errors 522 within a received codeword 510 corresponding to the user data 204, or a combination thereof.

The received codeword 510 can include the accessed or received data corresponding to or intended to be the user data 204, the base protection data 206 of FIG. 2, or a combination thereof. The received codeword 510 can include the unintended errors 522 or corruptions and can be different from the user data 204, the base protection data 206, or a combination thereof.

The decoder 501 can include a circuit, a function, a process, a method, or a combination thereof for reverting information from a coded format to recover the originally intended information. The decoder 501 can correspond to a circuit, a device, a function, or a combination thereof for decrypting, receiving, recalling or accessing stored information, or a combination thereof for the received codeword 510 corresponding to the user data 204.

The decoder 501 can decode the received codeword 510 based on the access or received instance of the base set 208, the data unit 202 of FIG. 2, or a combination thereof. The computing system 100 can receive, access, provide, or a combination thereof for the received codeword 510. For example, the computing system 100 can receive the received codeword 510 corresponding to the base set 208 transmitted by another device. Also for example, the computing system 100 can provide the received codeword 510 corresponding to an attempt to access or recall the base set 208 or the user data 204.

The computing system 100 can similarly access or receive the extra protection data 210. For example, the computing system 100 receive the extra protection data 210 from another device communicated over a different resource or channel in comparison to the base set 208. Also for example, the computing system 100 can provide the extra protection data 210 from the data page 304 of FIG. 3 different than storage of the base protection data 206.

As a more specific example, the computing system 100 can utilize an access circuit, including one or more control circuits 103 illustrated in FIG. 1, to access or provide the base set 208, the extra protection data 210, or a combination thereof stored in a NAND flash device, such as for one or more of the storage circuits 105 illustrated in FIG. 1. The received codeword 510 can be the corresponding result of accessing data intended to be the base set 208. The received codeword 510 can correspond to the shortened-word 212 of FIG. 2 for the user data 204.

Subsequently, the decoder 501 can decode the received codeword 510 according to the encoding-decoding mechanism 170 of FIG. 1, such as the BCH mechanism 172 of FIG. 1, the RS mechanism 174 of FIG. 1, or a combination thereof. The decoder 501 can decode the received codeword 510 to correct the unintended error 522 therein and access the user data 204.

The decoder 501 can utilize the base protection data 206, the extra protection data 210, or a combination thereof for the decoding process. The decoder 501 can decode the received codeword 510 to recover the user data 204 using the base protection data 206. The decoder 501 can further decode the received codeword 510 to recover the user data 204, the base protection data 206, or a combination thereof using the extra protection data 210.

For an illustrative example, the decoder 501 can include a syndrome module 502, a locator module 504, a search module 506, a further protection module 508, or a combination thereof for BCH implementation. The further protection module 508 can be coupled to the syndrome module 502. The syndrome module 502 can be coupled to the locator module 504, the further protection module 508 or a combination thereof. The locator module 504 can be further coupled to the further protection module 508, the search module 506, or a combination thereof.

The modules can be coupled using wired or wireless connections, by having an output of one module as an input of the other module, by having operations of one module influence operation of the other module, or a combination thereof. The modules can be directly coupled with no intervening structures or objects other than the connector there-between, or indirectly coupled through intervening structures or objects.

The syndrome module 502 is configured to initially detect the unintended errors 522 using the base protection data 206. The syndrome module 502 can perform the initial detection by calculating a base syndrome 514 for the decoding process. The base syndrome 514 is a decoding parameter associated with existence or absence of the unintended errors 522, a location thereof, or a combination thereof. The base syndrome 514 can correspond to the base protection data 206 without the extra protection data 510. The base syndrome 514 can be an error detection output.

The syndrome module 502 can calculate or generate the base syndrome 514 based on or from processing the received codeword 510. For example, the syndrome module 502 can calculate or generate the base syndrome 514 based on processing, such as for dividing or modulo operation, the received codeword 510. The decoder 501 can utilize the same generator polynomial or assume the same generator polynomial as predetermined by the computing system 100.

As a more specific example, the received codeword 510 can be represented as:

$$r(x)=c(x)+e(x), \quad \text{Equation (1)}.$$

The base set 208 can be represented as 'c(x)', which can consist of the user data 204 and the base protection data 206, such as the original BCH parity. The term 'e(x)' can represent the unintended errors 522. The base syndrome 514 can be represented as:

$$S_i=r(\alpha^i), i=1,2,\ldots,2t, \quad \text{Equation (2)}.$$

The index parameter 'i' can range from 1 to '2t', where 't' can represent the maximum number of bits or symbols, or a size of the unintended errors 522 that can be corrected using the base protection data 206 only.

The syndrome module 502 can calculate or generate the base syndrome 514 based on a primitive root 518. The primitive root 518 is a root or a basic structure of the coding pattern 402 of FIG. 4, such as the primitive polynomial, for the decoding process. The primitive root 518 can be based on the coding pattern 402 or a root thereof. The primitive root 518 can be known or assumed at the decoder 501 based on the generator polynomial or other parameters predetermined by the computing system 100.

The primitive root 518 can be represented as 'a'. For any codeword without error, the syndrome can be based on $c(a)=\ldots=c(\alpha^{2t})=0$.

After performing initial detection of the unintended errors 522, the control flow can pass from the syndrome module 502 to the locator module 504 or the further protection module 508. For example, the control flow can pass by having a processing result, such as the base syndrome 514 or a portion thereof as an output from the syndrome module 502 to an input of the locator module 504 or the further protection module 508.

Also for example, the control flow can further pass by storing the processing result at a location known and accessible to the locator module 504 or the further protection module 508. Also for example, the control flow can further pass by notifying the locator module 504 or the further protection module 508, such as by using a flag, an interrupt, a status signal, or a combination thereof. Also for example, the control flow can further pass using a combination of the processes described above.

The further protection module 508 is configured to additionally detect the unintended errors 522 using the extra protection data 210. The further protection module 508 can perform the additional error detection by calculating a further syndrome 516 for the decoding process. The further protection module 508 can be similar to the syndrome module 502, but for processing the further syndrome 516 corresponding to the extra protection data 210 instead of the base syndrome 514 corresponding to the base protection data 206.

The further syndrome 516 is a decoding parameter associated with existence or absence of error, a location thereof, or a combination thereof in addition to the base syndrome 514. The further syndrome 516 can correspond to the extra protection data 510. The further syndrome 516 can be calculated from or based on the extra protection data 210. The further syndrome 516 can be an error detection output corresponding to an expanded parameter set 518, representing additional equations or methods corresponding to the additional or expanded coding power.

The expanded parameter set 518 can be equations, known information, methods, or a combination thereof in addition to the ones corresponding to the base syndrome 514 utilized to decode using the base protection data 206, such as for BCH decoding process. The expanded parameter set 518 can be different than, modified from, associated with, or a combination thereof than the parameter set utilized for processing the BCH decoding process.

The further syndrome 516 can be a processing result of using the expanded parameter set 518 representing additional equations or known information utilized to detect, correct, or a combination thereof for the unintended errors 522 exceeding the capability or known information provided by the base syndrome 514. As an illustrative example for BCH codes, the further syndrome 516 can be represented as:

$$S_i=r(\alpha^i), i=2t+1, 2t+2, \ldots, 2t', \quad \text{Equation (4)}.$$

The index parameter can range from value after '2t' for '2(t'-t)' extra syndrome outputs with 't'' corresponding to the size or capacity of the extra protection data 210 and the increase in power or capacity for the error correction, such as the maximum number of errors it can correct with the extra protection data 210. The expanded parameter set 518 can include the additional equations, patterns, methods, known information, or a combination thereof corresponding to '2t+1, 2t+2, ..., 2t'' beyond '1, 2, ..., 2t' for the base syndrome 514.

The index parameters and the expanded parameter set 518 can be adjusted for different coding schemes. For example, the index can be 2t+1, 2t+2, ..., 2t' for RS codes.

The computing system 100 can utilize the extra protection data 210 to correct up to 't'' bits or symbols of the unintended errors 522. As an illustrative example, the extra protection data 210 can include (t'-t) syndrome data or symbols for BCH codes, and '2(t'-t)' syndrome data or symbols for RS codes.

The further protection module 508 can calculate or generate the further syndrome 516 similar to the syndrome module 502. For example, the further protection module 508 can calculate or generate the further syndrome 516 based on the primitive root 518.

Also for example, the further protection module 508 can process the received codeword 510 corresponding to the data unit 202 including the extra protection data 210 instead of or in comparison to the received codeword 510 without the extra protection data 210 for the syndrome module 502. The further syndrome 516 can be based on $S_{2t+1}=c(\alpha^{2t+1})$, $S_{2t+3}=c(\alpha^{2t+3}), \ldots, S_{2t'-1}=c(\alpha^{2t'-1})$, which may or may not be all zeros as $c(\alpha)=\ldots=c(\alpha^{2t})=0$.

When decoding the received codeword 510, represented as '$r(r_0, \ldots, r_{n-1})$' whose polynomial is '$r(x)=r_0+\ldots+r_{n-1}x^{n-1}$', the syndrome module 502 can compute the base syndrome 514, represented as '$S_i=r(\alpha^i)$, $1 \leq i \leq 2t$'. Meanwhile, the further protection module 508 can also compute the further syndrome 516, represented as '$S_j=r(\alpha^j)$', for $j=2t+2, 2t+4, \ldots, 2t''$ and '$S_i=r(\alpha^j)-EP_j=r(\alpha^j)+EP_j$', for $j=2t+1, 2t+3, \ldots, 2t'-1$'. The term '$EP_j$' can represent the stored syndromes that were computed with error free codeword when encoding, such as $EP_{2t+1}=c(\alpha^{2t+1})$, $EP_{2t+3}=c(\alpha^{2t+3}), \ldots, EP_{2t'-1}=c(\alpha^{2t'-1})$ for the syndromes described above. Because the computation is in binary field, the relationship '$r(\alpha^j)-EP_1=r(\alpha^j)+EP_1$' can hold. For hardware implementation, this can be achieved by initializing the shift registers to corresponding instances of the extra protection data 210 instead of zeros.

The further protection module 508 can further compute the further syndrome 516 based on setting initial values to the extra protection data 510 instead of initializing values to 0. The further protection module 508 can further perform 'XOR' function for the further syndrome 516 with the stored instances of the extra protection data 510.

The further protection module 508 can be utilized or implemented upon indication of failure from the base syndrome 514. The further protection module 508 can be utilized or implemented for resources, such as pages or channels, that are known or detected to be 'bad' to the computing system 100 according to a predetermined mechanism.

For example, the decoder 501 can first try to decode using the base set 208 through the syndrome module 502. If the decoding fails with the base set 208, likely indicating number of errors exceeding 't', the decoder 501 can load corresponding instances of the extra protection data 510 and perform the enhanced decoding through the further protection module 508.

The further protection module 508 can calculate or generate the further syndrome 516 independent or separate from the syndrome module 502 and the base syndrome 514. The further protection module 508 can calculate or generate the further syndrome 516 in parallel with, simultaneously with, or a combination thereof relative to the syndrome module 502. The further protection module 508 can calculate or generate the further syndrome 516 without relying or utilizing the base syndrome 514.

As mentioned above, the syndrome module 502 and the further protection module 508 have been illustrated using BCH coding as an example. However, it is understood that the decoder 501 can process for other coding schemes. As a specific example, the further protection module 508 can process the further syndrome 516 based on '$S_j=r(\alpha^j)-EP_j$', for $j=2t+1, 2t+2, \ldots, 2t''$ for RS codes.

After performing additional detection of errors, the control flow can pass from the further protection module 508 to the locator module 504 for the decoder 501 to further decode the received codeword 510 in recovering the user data 204, the base protection data 206, or a combination thereof using the base syndrome 514 and the further syndrome 516. The control flow can pass in a manner similar to the manner described above between the syndrome module 502 and the locator module 504 or the further protection module 508, but using the processing results of the further protection module 508, such as the further syndrome 516 or a processing result thereof as discussed above.

The locator module 504 is configured to determine a location indicator 520. The locator module 504 can generate the location indicator 520 using the base syndrome 514, the further syndrome 516, or a combination thereof. The locator module 504 can generate the location indicator 520 based on the base syndrome 514, the further syndrome 516, or a combination thereof.

For example, the location indicator 520 can include an error locator polynomial utilized in BCH. Also for example, the locator module 504 can utilize Berlekamp-Massey mechanism to compute the location indicator 520. The location indicator 520 can be represented as '$\Lambda_1, \Lambda_2, \ldots, \Lambda_v$' where '$v \leq t$'.

After determining error locator polynomial, the control flow can pass from the locator module 504 to the search module 506. The control flow can pass in a manner similar to the manner described above between the syndrome module 502 and the locator module 504 or the further protection module 508, but using the processing results of the locator module 506, such as the location indicator 520.

The search module 506 is configured to find the location and correct the unintended error 522. The search module 506 can correct the unintended error 522 based on the location indicator 520 in recovering the user data 204, the base protection data 206, or a combination thereof. The search module 506 can correct the unintended error 522 using the location indicator 520 corresponding to the base protection data 206. If the base protection data 206 is insufficient, such as in a failed parity check, the search module 506 can correct the unintended error 522 using the location indicator 520 corresponding to the extra protection data 210.

The search module 506 can utilize simple logic implemented in hardware, software, or a combination thereof. For example, the search module 506 can utilize a Chien Search mechanism and go through $\Lambda(\alpha^i)$ for $i=1, 2, \ldots, n$ using v constant multiplications. Details regarding the locator module 504 and the search module 506 are discussed below.

For illustrative purposes, the decoder 501 is shown with the syndrome module 502 separate from the further protection module 508. However, it is understood that the syndrome module 502 and the further protection module 508 can be implemented differently. For example, the syndrome module 502 and the further protection module 508 using same or similar circuitry, instructions, processes or methods, or a combination thereof. Also for example, the syndrome module 502 and the further protection module 508 can be implemented as different portions within one module or circuitry set. Also for example, syndrome module 502 and the further protection module 508 can be implemented in an iterative process using the same or similar function or circuitry.

The decoder 501 can use or be implemented as a portion within one or more control circuits 103 of FIG. 1, such as for the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof. The computing system 100 can store the various input or output information, such as the user data 204, the base protection data 206, the base set 208, the extra protection data 210, syndromes 514 or 516, the primitive root 518, the location indicator 520, or a combination thereof in one or more storage circuits 105 of FIG. 1 or access circuits, such as for the host memory 106, the memory cache 117 of FIG.

1, the solid state disk 110 of FIG. 1, the non-volatile memory 112 of FIG. 1, the hard disk drives 116 of FIG. 1, the NAS devices 122 of FIG. 1, or a combination thereof. The decoder 501 can be implemented in software, such as using functions or operators, in hardware, such as using circuits with registers or adders or multipliers, or a combination thereof.

The computing system 100 can utilize the decoder 501 or a portion therein to calculate or generate the extra protection data 210. The use of the decoder 501 to calculate or generate the extra protection data 210 has been illustrated as an example in a bottom section of FIG. 5 below a dotted-slash line separating the example illustration for the decoding implementation. The computing system 100 can utilize the decoder 501 or a portion therein for enhancing the encoding process and to expand or enhance the coding power.

The computing system 100 can calculate or generate the extra protection data 210 based on inputting the base set 208 into the decoder 501 or a portion therein, such as the syndrome module 502, the further protection module 508, or a combination thereof. The computing system 100 can utilize the resulting output as the extra protection data 210.

The extra protection data 210 can be calculated or generated based on or leveraged from the expanded parameter set 518. The extra protection data 210 can different from the base syndrome 514 due to or because of the expanded parameter set 518.

Without the expanded parameter set 518, the output from feeding the base set 208 into the decoder 501 or a portion therein can be equivalent or similar to processing the received codeword 510 without any of the unintended errors 522. The corresponding result or syndrome can be based on $c(\alpha) = \ldots = c(\alpha^{2t}) = 0$ as discussed above.

In comparison, the expanded parameter set 518, having same type or category of formats, equations, process, or methods as for the base syndrome 514 but with different values or instances, can be utilized to provide additional or enhanced coding power for the encoding process. As such, the computing system 100 can utilize the decoder 501 or a portion therein, in addition to the encoder 401, to further encode or strengthen the user data 204, the base set 208, or a combination thereof. Further, it has been discovered that the enhanced coding power can be provided using existing and necessary circuitry, so as to provide the improvements without or with minimal changes or additional circuitry.

The computing system 100 can store the extra protection data 210 corresponding to the base set 208. The computing system 100 can store the extra protection data 210 in the data page 304 of FIG. 3 different than storage of the base protection data 206. For example, the extra protection data 210 can be stored on a known "good" page or with better retention or error measurements than a known "bad" page or the page storing the base set 208.

The computing system 100 can further encode the extra protection data 210 to provide protection or recoverability for the extra protection data 210. The computing system 100 can calculate the additional protection 306 of FIG. 3 based on processing or encoding the extra protection data 210 using the different encoding mechanism 308 of FIG. 3. The additional protection 306 can be stored with the extra protection data 210 or separate from the extra protection data 210, such as on the same page or on different pages.

The computing system 100 can calculate or generate the extra protection data 210 together with or immediately subsequent to the encoding process. The computing system 100 can further calculate or generate the extra protection data 210 separately or at a later time than the encoding process, such as when performance metrics for the data pages storing the base set 208 fall below a predetermined threshold. The computing system 100 can later access, receive, or recall the extra protection data 210 during the decoding process as discussed above.

Figure 6:
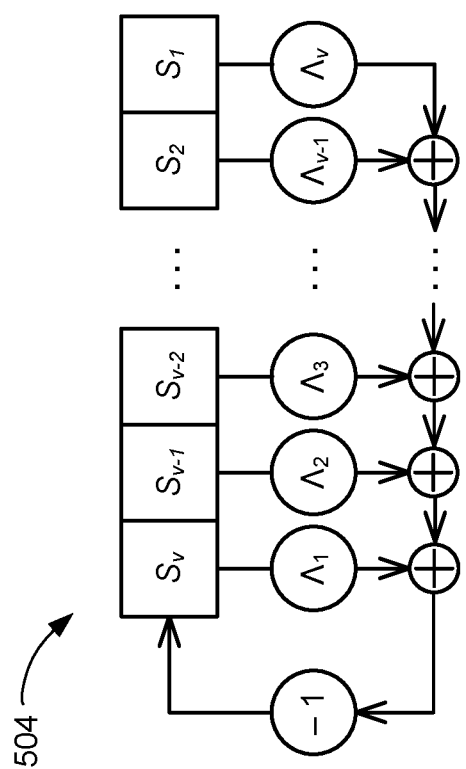
FIG. 6 is an exemplary detailed diagram of the locator module in an embodiment.

Referring now to FIG. 6, therein is shown an exemplary detailed diagram of the locator module 504 in an embodiment. The exemplary detailed diagram can be for illustrating the locator module 504 for BCH coding. However, it is understood that the locator module 504 can be adjusted or implemented differently for other coding schemes as discussed above.

The locator module 504 can receive the base syndrome 514 of FIG. 5, the further syndrome 516 of FIG. 5, or a combination thereof. The locator module 504 can calculate the shortest instance of the location indicator 520 of FIG. 4, represented as '$\Lambda_1, \Lambda_2, \ldots, \Lambda_v$', to generate '$S_{v+1}, \ldots, S_{2t}$' from '$S_1, \ldots, S_v$'. For example, the locator module 504 can utilize a Berlekamp-Massey mechanism, a Reeds-Sloane mechanism, a Berlekamp-Welch mechanism, or a combination thereof to calculate the shortest instance.

The illustrative diagram in FIG. 6 is shown with the locator module 504 including a number or quantity chains or portions corresponding to the base set 208 of FIG. 2 or the base syndrome 514. However, it is understood that the locator module 504 can include a greater number or quantity of chains or portions corresponding to the base set 208 or the base syndrome 514, the extra protection 510 or the data set 202 of FIG. 2 or the further syndrome 516, a greater of the two, or a combination thereof.

The locator module 504 can similarly calculate the portion of the location indicator 520 corresponding to the further syndrome 516. The locator module 504 can calculate the location indicator 520 iteratively in portions, such as for the base syndrome 514 and the further syndrome 516 across different iterations. The locator module 504 can calculate the location indicator 520 for or across the base syndrome 514 and the further syndrome 516 simultaneously. The locator module 504 can be implemented in software, such as using functions or operators, in hardware, such as using circuits with registers or adders or multipliers, or a combination thereof.

Figure 7:
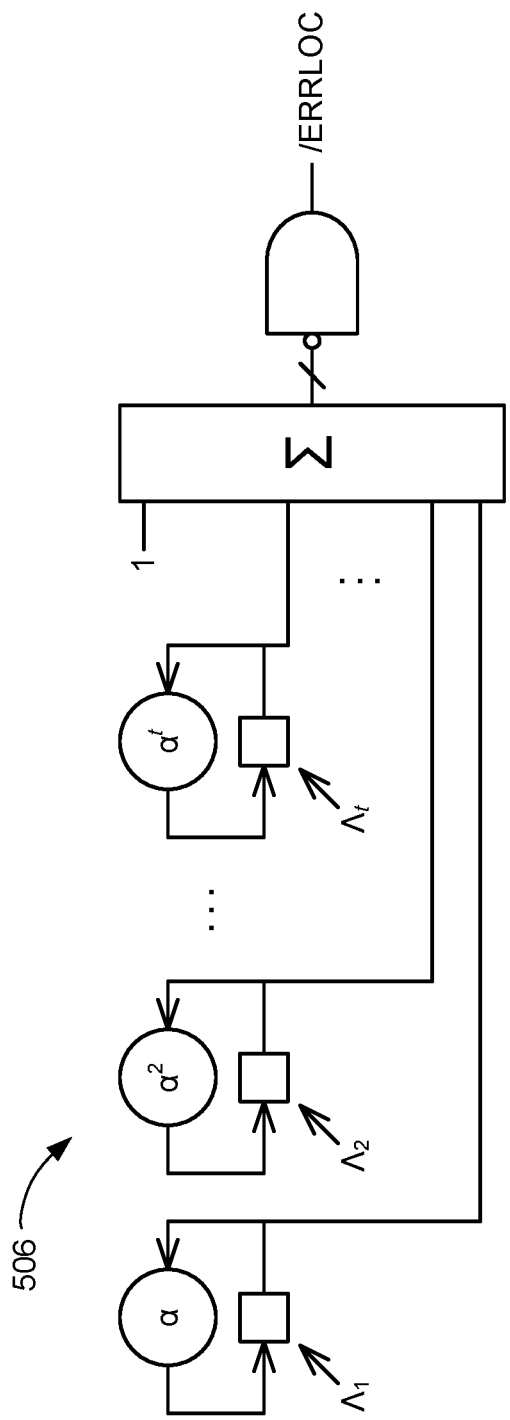
FIG. 7 is an exemplary detailed diagram of the search module in an embodiment.

Referring now to FIG. 7, therein is shown an exemplary detailed diagram of the search module 506 in an embodiment. The exemplary detailed diagram can be for illustrating the search module 506 for BCH coding. However, it is understood that the search module 506 can be adjusted or implemented differently for other coding schemes as discussed above.

The search module 506 can be configured to determine the roots of the error-locator polynomials or the location indicator 520 of FIG. 5. The computing system 100 can utilize the roots to determine the location and correct the errors in the user data 204 of FIG. 2, the base protection data 206 of FIG. 2, or a combination thereof. As a more specific example, the search module 506 can utilize the Chien Search mechanism to go through '$\Lambda(\alpha^i)$' for i=1, 2, ..., n' using 'v' constant multiplications as exemplified in FIG. 7. The search module 506 can be implemented in software, such as using functions or operators, in hardware, such as using circuits with registers or adders or multipliers, or a combination thereof.

Figure 8:
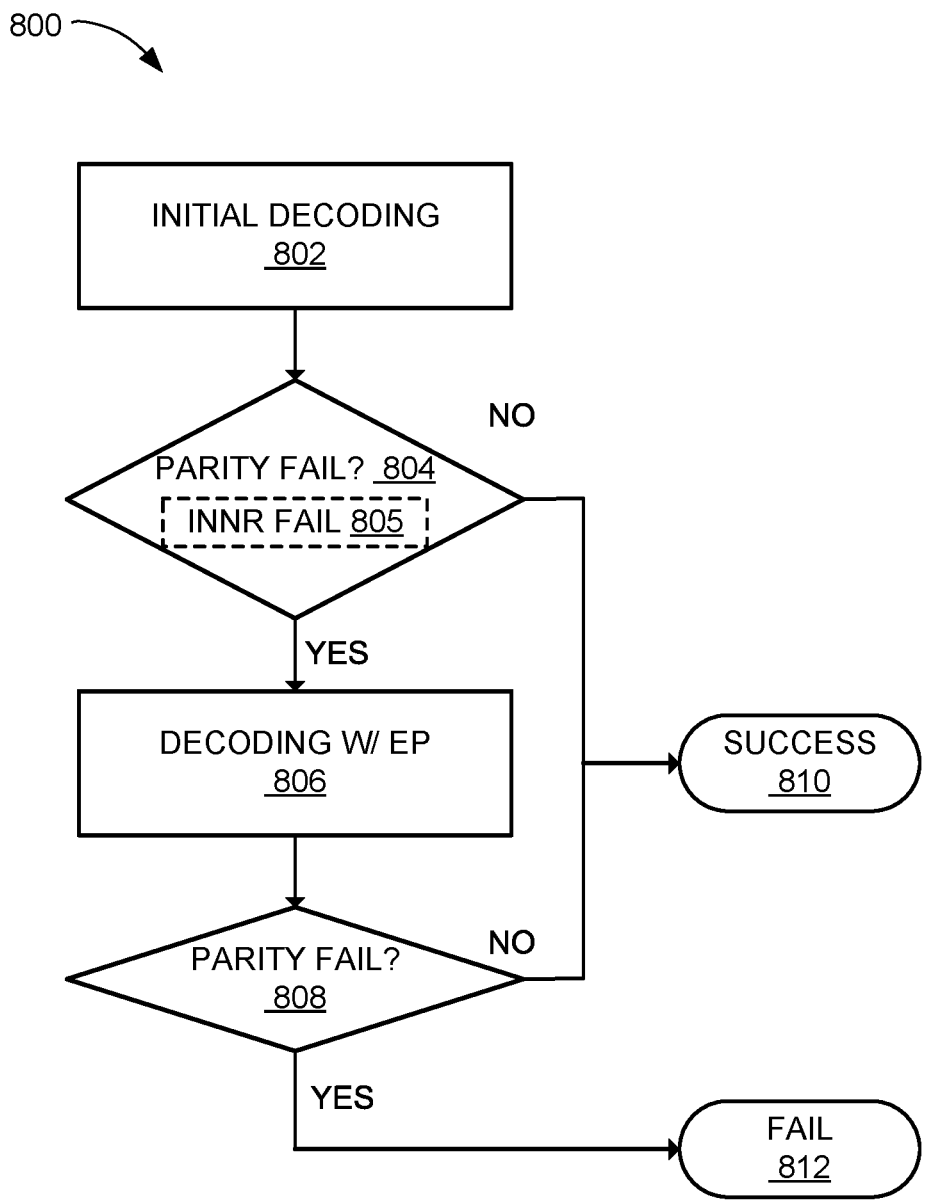
FIG. 8 is an exemplary flow diagram of the decoder of FIG. 5 in an embodiment.

Referring now to FIG. 8, therein is shown an exemplary flow diagram 800 of the decoder 501 of FIG. 5 in an embodiment. The diagram 800 can include initial decoding as represented in a box 802, initial check for parity pass/fail represented in a box 804, decoding with extra parity represented in a box 806, subsequent check for parity pass/fail represented in a box 808, successful decoding as represented in a box 810, and a failed decoding attempt as represented in a box 812.

The computing system 100 of FIG. 1 can implement the initial decoding of box 802 using the syndrome module 502 of FIG. 5, the locator module 504 of FIG. 5, the search module 506 of FIG. 5, or a combination thereof without the further protection module 508 of FIG. 5. The initial decoding of box 802 can be performed using the base set 208 of FIG. 2 without utilizing the extra protection data 210 of FIG. 2.

The computing system 100 can check the parity, as represented in the box 804, based on the result of the decoding process represented in the box 802. If the parity check passes, the decoding process is considered a success, as represented in the box 810.

The computing system 100 can determine an inner-decoding failure status 805 based on failing the parity check for the base set 208, such as using the base syndrome 514 of FIG. 5 or the base protection data 206 of FIG. 2. For example, the computing system 100 can determine the inner-decoding failure status 805 based on the base syndrome 514 corresponding to decoding the received codeword 510 of FIG. 5 with the base protection data 206.

The additional decoding process that utilizes the extra parity, or the extra protection data 510, as represented in the box 806, is only utilized or implemented if the parity check represented in the box 804 fails. For example, the computing system 100 can decode the received codeword 510 using the extra protection data 210 based on the inner-decoding failure status 508.

The additional decoding of the box 806 can use the further protection module 508, the syndrome module 502, the locator module 504, the search module 506, or a combination thereof. The additional decoding can be performed using the base set 208, the extra protection data 210, or a combination thereof.

The computing system 100 can subsequently check the parity, as represented in the box 808, based on the result of the additional decoding process represented in the box 806. If the parity check passes, the decoding process is considered a success, as represented in the box 810. If the parity check fails, the overall decoding process can be considered as failure.

Figure 9:
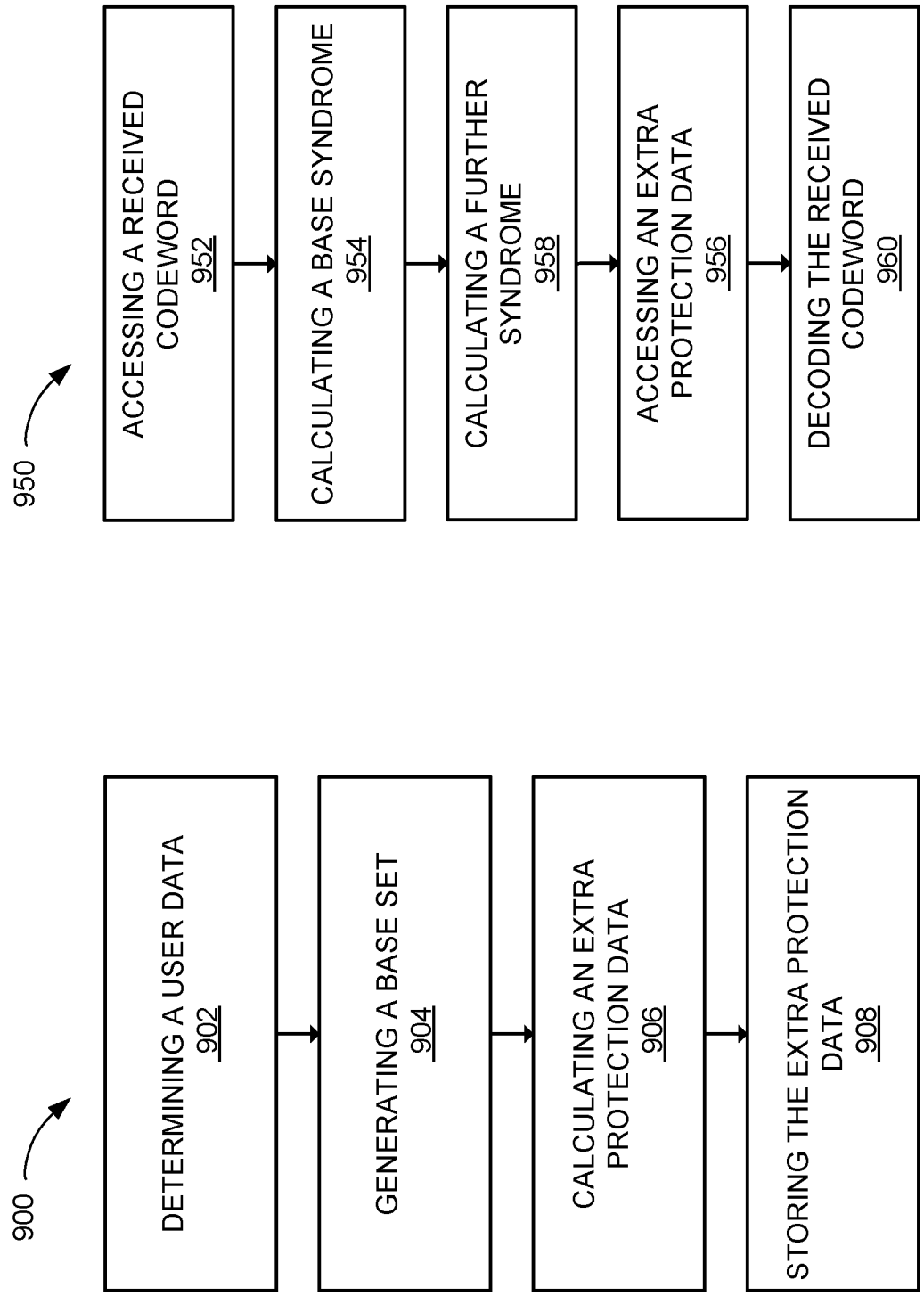
FIG. 9 is a flow chart of a method of operation of a computing system in an embodiment of the present invention.

Referring now to FIG. 9, therein is shown a flow chart of a method 900 of operation of a computing system 100 in an embodiment of the present invention. The method 900 includes: determining a user data in a block 902; generating a base set including a base protection data based on encoding the user data in a block 904; calculating with a control circuit an extra protection data based on encoding the base set in a block 906; and storing the extra protection data corresponding to the base set in a block 908.

A further flow chart of a further method 950 of operation of the computing system 100 in an embodiment of the present invention is also shown in FIG. 9. The further method 950 includes: accessing a received codeword corresponding to a user data and a base protection data in a box 952; calculating a base syndrome from the received codeword in a box 954; accessing an extra protection data corresponding to the received codeword in a box 956; calculating a further syndrome from the extra protection data in a box 958; and decoding the received codeword to recover the user data using the base syndrome and the further syndrome in a box 960.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
    a storage circuit configured to:
        provide a received codeword corresponding to a user data and a base protection data,
        provide an extra protection data corresponding to the received codeword, includes the extra protection data stored apart from the user data and the base protection data;
    a control circuit, coupled to the storage circuit, configured to:
        calculate a base syndrome from the received codeword,
        calculate a further syndrome from the extra protection data, and
        decode the received codeword to recover the user data, the base protection data, or a combination thereof using the base syndrome and the further syndrome when the base protection data cannot correct the user data; and
    a shift register encoder, coupled to the control circuit, configured to:
        encode the base syndrome and the extra protection data based on a coding pattern.

2. The system as claimed in claim 1 wherein the storage circuit is configured to provide the extra protection data from a data page different than storage of the base protection data.

3. The system as claimed in claim 1 wherein the control circuit is configured to:
    calculate a base syndrome based on a primitive root; and
    calculate a further syndrome based on the primitive root.

4. The system as claimed in claim 1 wherein:
    the storage circuit is configured to provide the received codeword including an unintended error;
    the control circuit is configured to decode the received codeword based on:
        generating a location indicator based on the base syndrome and the further syndrome, and
        correcting the unintended error based on the location indicator to recover the user data, the base protection data, or a combination thereof.

5. The system as claimed in claim 1 wherein the control circuit is configured to:
    determine an inner-decoding failure status based on the base syndrome corresponding to decoding the received codeword with the base protection data; and
    decode the received codeword using the extra protection data based on the inner-decoding failure status.

6. The system as claimed in claim 1 wherein:

the storage circuit is a NAND flash device configured to access the received codeword stored therein, wherein the received codeword includes a shortened-word for the user data; and the control circuit is configured to decode the received codeword according to a Bose-Chaudhuri-Hocquenghem (BCH) mechanism, a Reed-Solomon (RS) mechanism, or a combination thereof.

7. A method of operation of a computing system comprising:

accessing a received codeword corresponding to a user data and a base protection data;

calculating a base syndrome from the received codeword;

accessing an extra protection data corresponding to the received codeword, including accessing the extra protection data stored apart from the user data and the base protection data;

calculating a further syndrome from the extra protection data;

decoding the received codeword to recover the user data, the base protection data, or a combination thereof, by a control circuit, using the base syndrome and the further syndrome when the base protection data cannot correct the user data; and encoding the base syndrome and the extra protection data, by a shift register encoder, based on a coding pattern.

8. The method as claimed in claim 7 wherein accessing the extra protection data includes accessing the extra protection data from a data page different than storage of the base protection data.

9. The method as claimed in claim 7 wherein:

calculating the base syndrome includes calculating the base syndrome based on a primitive root; and calculating the further syndrome includes calculating the further syndrome based on the primitive root.

10. The method as claimed in claim 7 wherein:

accessing the received codeword includes accessing the received codeword the received codeword including an unintended error;

decoding the received codeword includes:

generating a location indicator based on the base syndrome and the further syndrome, and correcting the unintended error based on the location indicator to recover the user data, the base protection data, or a combination thereof.

11. The method as claimed in claim 7 further comprising:

determine an inner-decoding failure status based on the base syndrome corresponding to decoding the received codeword with the base protection data; and wherein:

decoding the received codeword includes decoding the received codeword using the extra protection data based on the inner-decoding failure status.

12. The method as claimed in claim 7 wherein:

accessing the received codeword includes accessing the received codeword from a NAND flash device, wherein the received codeword includes a shortened-word for the user data; and decoding the received codeword includes decoding the received codeword according to a Bose-Chaudhuri-Hocquenghem (BCH) mechanism, a Reed-Solomon (RS) mechanism, or a combination thereof.

* * * * *